United States Patent
Trivedi

(10) Patent No.: US 7,078,284 B2
(45) Date of Patent: *Jul. 18, 2006

(54) METHOD FOR FORMING A NOTCHED GATE

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/335,956

(22) Filed: Jan. 2, 2003

(65) Prior Publication Data

US 2003/0235943 A1 Dec. 25, 2003

Related U.S. Application Data

(63) Continuation-in-part of application No. 10/176,228, filed on Jun. 20, 2002, now Pat. No. 6,524,901.

(51) Int. Cl.
*H01L 21/336* (2006.01)
(52) U.S. Cl. .................. 438/197; 438/183; 438/585
(58) Field of Classification Search ........... 438/197, 438/103, 585
See application file for complete search history.

(56) References Cited

U.S. PATENT DOCUMENTS

| 4,430,792 | A | 2/1984 | Temple |
| 4,845,534 | A | 7/1989 | Fukuta |
| 5,545,578 | A | 8/1996 | Park et al. |
| 5,834,817 | A | 11/1998 | Satoh et al. |
| 6,060,358 | A | 5/2000 | Bracchitta et al. |
| 6,121,666 | A | 9/2000 | Burr |
| 6,127,232 | A | 10/2000 | Chatterjee et al. |
| 6,180,978 | B1 | 1/2001 | Chatterjee et al. |
| 6,204,133 | B1 | 3/2001 | Yu et al. |
| 6,306,715 | B1 | 10/2001 | Chan et al. |
| 6,337,262 | B1 | 1/2002 | Pradeep et al. |
| 6,451,639 | B1 * | 9/2002 | Jang et al. ............. 438/183 |
| 2002/0000623 | A1 * | 1/2002 | Cho et al. ............. 257/388 |

FOREIGN PATENT DOCUMENTS

WO    WO 00/34984    6/2000

* cited by examiner

*Primary Examiner*—Jack Chen
(74) *Attorney, Agent, or Firm*—Dinsmore & Shohl LLP

(57) ABSTRACT

Methods for forming notched gates and semiconductor devices utilizing the notched gates are provided. The methods utilize the formation of a dummy gate on a substrate. The dummy gate is etched to form notches in the dummy gate, and sidewall spacers are formed on the sidewalls of the notched dummy gate. The dummy gate is removed, and a notched gate is formed. The methods allow the height and depth of the notches to be independently controlled, and transistors having shorter channel lengths are formed.

5 Claims, 6 Drawing Sheets

METHOD FOR FORMING A NOTCHED GATE

CROSS-REFERENCE TO RELATED APPLICATIONS

This application is a Continuation-in-Part of U.S. patent application Ser. No. 10/176,228, filed Jun. 20, 2002 now U.S. PAT. No. 6,524,901.

BACKGROUND

The present invention relates generally to integrated circuit transistors and in particular the present invention relates to methods of forming damascene transistor gates having a notched profile.

Integrated circuit manufacturers continually strive to scale down semiconductor devices in integrated circuit chips. Smaller scale semiconductor devices translate to increased speed and capacity while reducing power consumption. For example, in order to provide increased capacity in memory chips such as SRAM, it is highly desirable to shrink the size of each memory cell without significantly affecting performance. This may be accomplished by shrinking the size of each component of the memory cell, packing the components closer together, or both.

Integrated circuit transistors have source and drain regions and a gate electrode. The transistors are typically fabricated such that each have a doped polysilicon gate electrode. The source and drain regions are typically implanted into a substrate of silicon. A channel region is defined between the source and drain regions and beneath the gate electrode. A capacitance, known as overlap capacitance, may be created between the gate and the source/drain regions where the gate overlaps the source/drain regions. This capacitance affects how the transistor functions and is undesirable.

Additionally, for high performance devices, such as SRAM, it is desirable to form the shortest channel length transistors at a given lithography node. The channel length is the distance between the source and the drain. However, lithographic processes are limited, and fabrication processes are exploited to form transistors having channel lengths shorter than those possible with lithography alone. One such fabrication process is taught in U.S. Pat. No. 5,834,817 to Satoh et al. Satoh et al. utilizes a plasma etching method and layers having different etching speeds to form shaped gate electrodes. However, this method can present difficulties with control of notch height and depth over a wide process range. Therefore, a need exists for a method of forming notched gate electrodes that allows the notch height and depth to be independently adjusted while providing transistors with shorter channel length and reduced overlap capacitance.

SUMMARY

This need is met by the present invention that provides methods for forming notched gate electrodes while allowing independent control of notch height and depth. These methods may be used in conjunction with conventional processing to provide transistors having shorter channel lengths.

In accordance with one embodiment of the present invention, a method of forming a notched gate is provided. The method comprises: supplying a substrate; forming a dummy gate on the substrate, wherein the dummy gate has sidewalls; etching the dummy gate to form laterally recessed notches in the dummy gate; forming sidewall spacers on the sidewalls of the dummy gate; removing the dummy gate to form a recess between the sidewall spacers; forming a gate oxide in the recess; and depositing a permanent gate material in the recess to form a notched gate. The method may further comprise depositing a layer of dielectric material over the dummy gate and removing the dielectric material overlying the dummy gate.

In accordance with another embodiment of the present invention, a method of forming a notched gate is provided. The method comprises: supplying a substrate; forming a well region in the substrate; forming at least one isolation region in the substrate; forming a dummy gate on the substrate over the well region, the dummy gate having sidewalls; etching said dummy gate to form laterally recessed notches in the dummy gate; forming extension regions in the well region after etching the dummy gate, the extension regions being formed within the well region adjacent to the dummy gate; forming sidewall spacers on the sidewalls of the dummy gate; forming doped regions in the well region adjacent to the sidewall spacers; depositing a layer of dielectric material over the dummy gate; removing the dielectric material overlying the dummy gate; removing the dummy gate to form a recess between the sidewall spacers; forming a gate oxide in the recess; and depositing a permanent gate material in the recess to form a notched gate.

The method may further comprise providing at least one pocket implant within said well region under said extension regions. The at least one isolation region may comprise an isolation trench. The layer of dielectric material may be formed by depositing an inter-layer dielectric material over the substrate and the dummy gate. The doped regions and the extension regions may comprise source/drain regions.

In accordance with yet another embodiment of the present invention, a method of forming a notched gate is provided. The method comprises: supplying a substrate; forming a dummy gate on the substrate, the dummy gate having sidewalls, wherein the dummy gate comprises at least one layer; etching one of the at least one layers to form laterally recessed notches in the dummy gate; forming sidewall spacers on the sidewalls of the dummy gate; removing the dummy gate to form a recess between the sidewall spacers; forming a gate oxide in the recess; and depositing a permanent gate material in the recess to form a notched gate. The method may further comprise depositing a layer of dielectric material over the dummy gate and removing the dielectric material overlying the dummy gate.

In accordance with another embodiment of the present invention, a method of controlling the notch dimensions of a damascene notched gate is provided. The method comprises: forming a dummy gate over a substrate, the dummy gate having sidewalls; etching the dummy gate to form laterally recessed notches in the dummy gate, wherein the etch is controlled to select the depth of the laterally recessed notches; forming sidewall spacers on the sidewalls of the dummy gate; removing the dummy gate to form a recess between the sidewall spacers; and depositing a permanent gate material in the recess to form a notched gate. The depth may be in the range of about 50 to about 200 Å.

In accordance with yet another embodiment of the present invention a method of controlling the notch dimensions of a damascene notched gate is provided. The method comprises: forming a dummy gate over a substrate, the dummy gate having sidewalls, wherein the dummy gate comprises at least one layer having a selected thickness; etching the dummy gate to form laterally recessed notches in the dummy gate, wherein the etch is controlled to select the depth of the laterally recessed notches, and wherein the height of the laterally recessed notches is determined by the selected thickness of one of the at least one layers; forming sidewall spacers on the sidewalls of the dummy gate; removing the dummy gate to form a recess between the sidewall spacers; and depositing a permanent gate material in the recess to form a notched gate. The height may be in the range of about 100 to about 500 Å, and the depth may be in the range of about 50 to about 200 Å.

In accordance with another embodiment of the present invention, a method of forming a notched gate is provided. The method comprises: supplying a substrate; forming a dummy gate on the substrate, the dummy gate having sidewalls, wherein the dummy gate comprises a first layer proximate to the substrate, wherein the first layer comprises a first dielectric layer, a second layer proximate to the first layer, and a third layer proximate to the second layer; etching the second layer to form laterally recessed notches in the dummy gate; forming sidewall spacers on the sidewalls of the dummy gate; depositing a layer of dielectric material over the dummy gate; removing the dielectric material overlying the dummy gate; removing the dummy gate to form a recess between the sidewall spacers; forming a gate oxide in the recess; and depositing a permanent gate material in the recess to form a notched gate. The step of etching the second layer may comprise a wet etch, and the first dielectric layer may be selected to be resistant to the wet etch. The first dielectric layer may be selected from gate oxide, silicon nitride, aluminum oxide, silicon carbide, hafnium oxide, and combinations thereof.

DETAILED DESCRIPTION OF THE PREFERRED EMBODIMENTS

Figure 1:
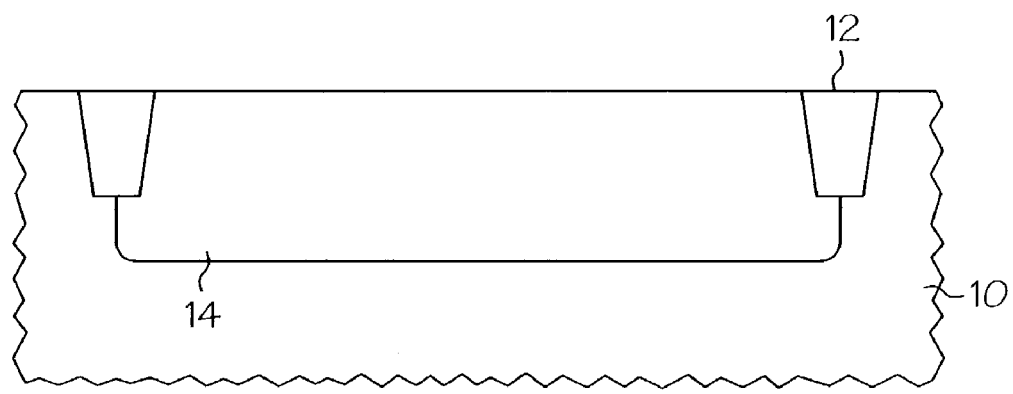
FIG. 1 illustrates a semiconductor substrate having a well region and isolation regions.

The present invention is directed toward a method of forming planar notched damascene gates and semiconductor devices utilizing the notched gates. The method allows the height and depth of the notch to be independently controlled and may be easily integrated into conventional processing systems.

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical, and electrical changes may be made without departing from the spirit and scope of the present invention. In the drawings, like numerals describe substantially similar components throughout the several views.

It shall be observed that the process steps and structures described herein do not form a complete process flow for manufacturing integrated circuits. The present invention can be practiced in conjunction with a variety of integrated circuit fabrication techniques, including those techniques currently used in the art. As such, commonly practiced process steps are included in the description herein only if those steps are necessary for an understanding of the present invention.

The transistor described herein has a gate electrode with a notched profile. The notch is generally formed before the formation of the source and drain regions, and the formation of the notch allows the source and drain extensions to be formed closer together than is generally possible when using traditional fabrication methods.

Referring to FIG. 1, a semiconductor substrate 10 is illustrated. The substrate 10 may be any structure having an exposed surface on which to form the notched gate of the present invention. The substrate 10 is generally a silicon wafer. The substrate 10 generally has a well region 14 and at least one isolation region 12 formed therein. As illustrated, the isolation regions 12 are isolation trenches, and the isolation regions 12 may be formed using any available technique, including for example shallow trench isolation (STI) methods. The well region 14 may be formed using any available techniques, including for example, ion implantation. The well region 14 may be an n-type or p-type well. The formation of the well region 14 is preferably performed after forming the isolation regions 12, but may be performed prior thereto. The wells define the locations of the n-channel and/or p-channel devices. Thus, the precise implants will be application specific. Optional implants (not shown) may be performed in the substrate 10. For example, an implant with low ion energies may be used to construct a field threshold voltage ($V_t$) implant to improve electrical isolation between active areas separated by isolation trenches and isolation regions because the implant results in a reduced doping profile and, thus, reduced electrical field and reduced leakage. Other types of implants including threshold implants or graded channel implants as needed for the intended application may also be embedded in the substrate 10.

Figure 2A:
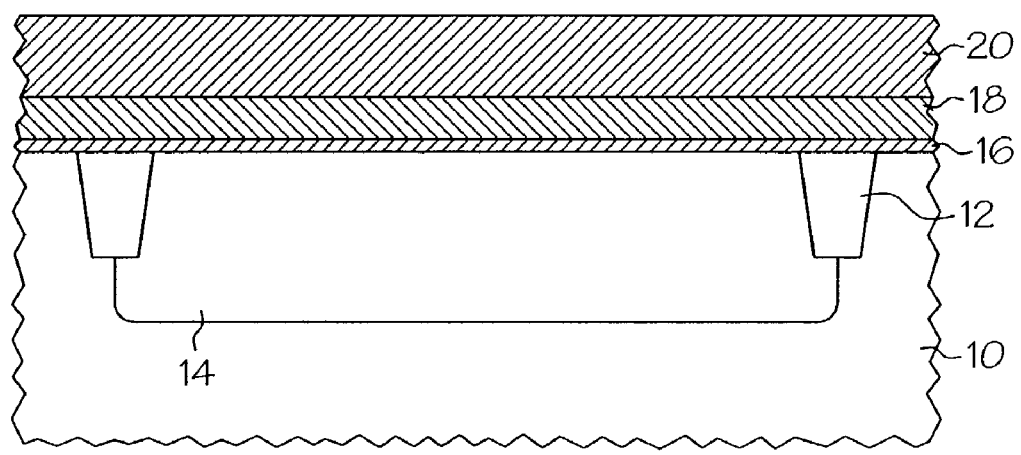
FIGS. 2a–2c illustrate the formation of a dummy gate in a stepwise fashion.

Referring to FIG. 2a, the layers necessary to form a dummy gate are formed overlying the substrate 10 and the well region 14. A first layer 16 is formed proximate to the substrate 10. A second layer 18 is formed proximate to the first layer 16, and a third layer 20 is formed proximate to the second layer 18. The first layer 16 may be a dielectric layer formed from dielectric materials. For example, the first layer 16 may comprise gate oxide, silicon nitride, aluminum oxide, silicon carbide, and hafnium oxide. Additionally, the first layer 16 may comprise laminates incorporating gate oxide, silicon nitride, aluminum oxide, and hafnium oxide or any other suitable dielectric material. The first layer 16 is a generally a sacrificial gate oxide layer. The sacrificial gate oxide may be grown on the substrate 10 by thermal oxidation of the base substrate, or by other techniques such as chemical vapor deposition (CVD). Although the first layer 16 is generally a sacrificial gate oxide, the first layer 16 may alternatively comprise any thin dielectric layer that is resistant to a wet etch that targets the second layer 18.

The second layer 18 is generally a silicon nitride layer. The silicon nitride may be deposited by plasma enhanced chemical vapor deposition (PECVD), low pressure chemical vapor deposition (LPCVD), or any other process known in the art. The second layer 18 may alternatively comprise any layer for which a selective wet etch is available. For example, the second layer 18 may comprise a tungsten metal gate. The tungsten metal gate may be selectively etched using a solution of sulfuric acid, hydrogen peroxide, and water. This wet etch is commonly referred to as a "Piranha etch". The thickness of the second layer 18 is controlled during deposition, and the thickness of the second layer 18 will determine the height of the notch that is subsequently formed. The second layer 18 generally has a thickness of about 100–500 Å. The third layer 20 generally comprises a polysilicon layer. The polysilicon may be deposited by low pressure chemical vapor deposition (LPCVD) or other techniques well known in the art. The third layer 20 may alternatively comprise any suitable capping layer that is resistant to the wet etch of the second layer 16.

Figure 2B:
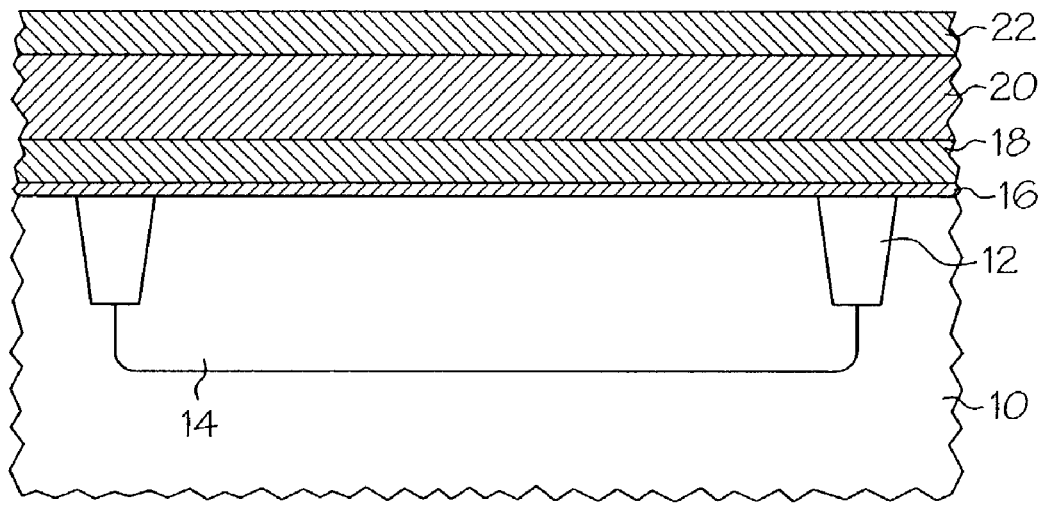
Figure 2C:
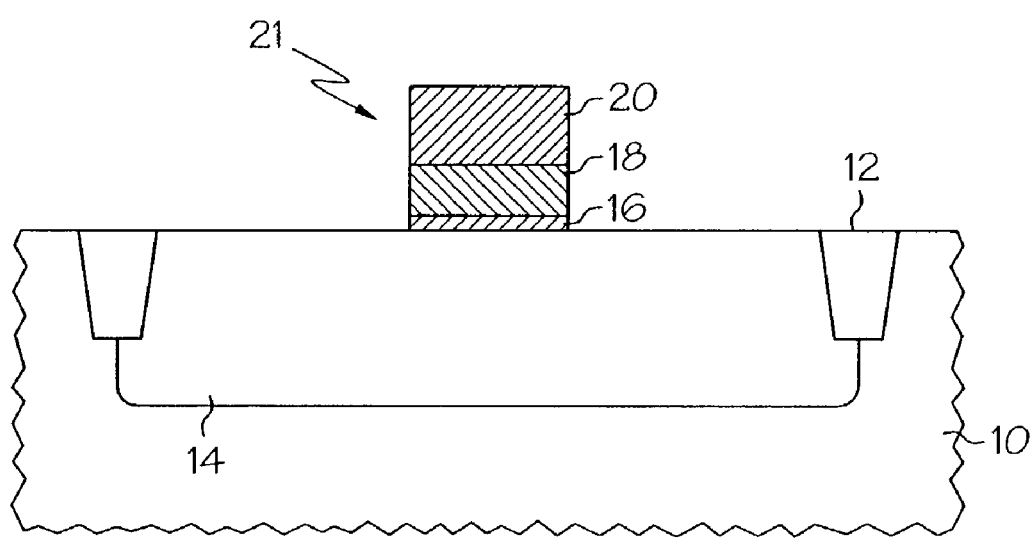

Referring to FIGS. 2b and 2c, the dummy gate 21 is formed utilizing a photolithographic process. As shown in FIG. 2b, a layer of photoresist 22 is formed proximate to the third layer 20. The photoresist is exposed in a conventional manner (not shown) to form a patterned mask over said third layer, and the unexposed photoresist is removed. The first 16, second 18, and third 20 layers are etched to form the dummy gate 21 and the photoresist layer 22 is stripped. Thus, a dummy gate 21 comprising first, 16, second 18 and third 20 layers overlies the well region 14.

Figure 3:
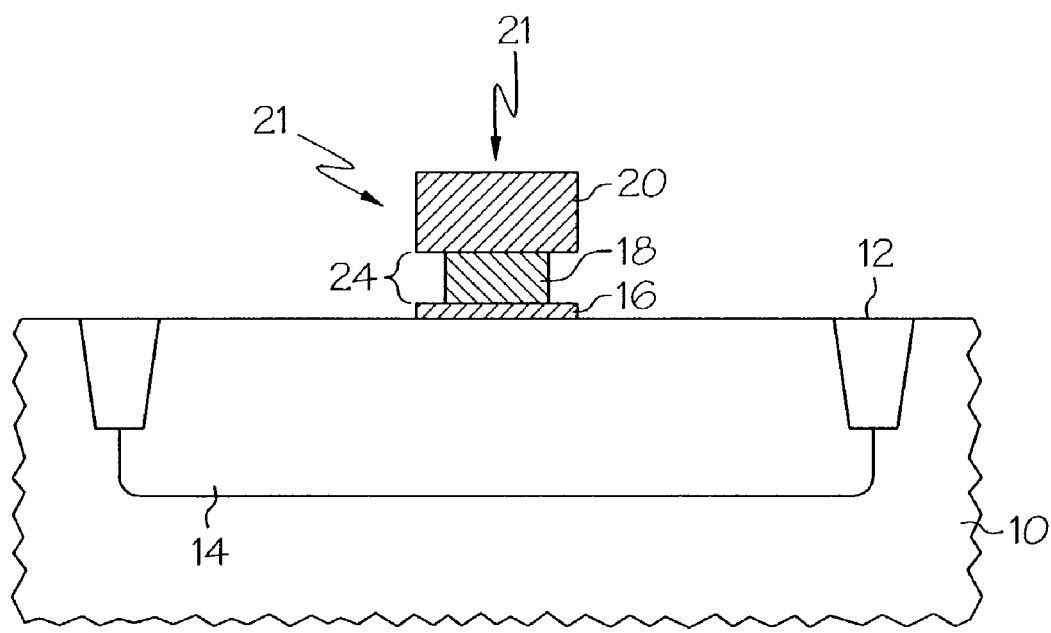
FIG. 3 illustrates the formation of lateral notches in a dummy gate.

After the dummy gate 21 has been formed, lateral notches 24 are formed in the dummy gate as shown in FIG. 3. The lateral notches 24 are formed by selectively etching the second layer 18. The selective etch is generally a wet etch, and the etchant is selected to etch the second layer 18 without etching the first 16 and third 20 layers. When the first layer 16 is a sacrificial gate oxide, the second layer 18 is silicon nitride, and the third layer 20 is polysilicon, a hot phosphoric acid etch may be used. The wet etch is controlled to select the depth of the lateral notches 24. The notches 24 are etched so that they have a depth in the range of about 50–200 Å.

Figure 4A:
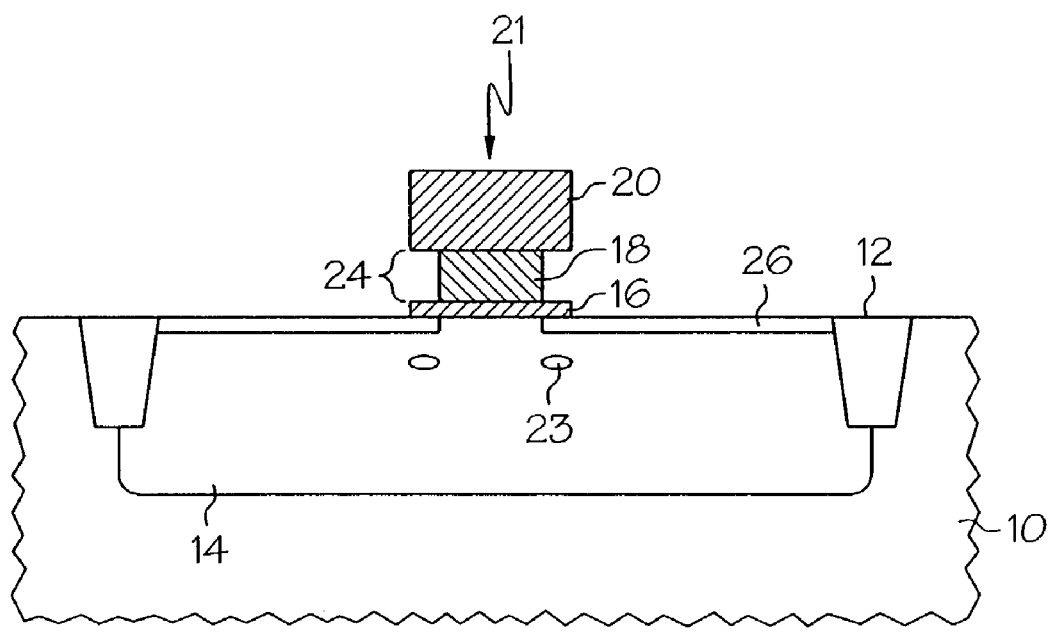
FIGS. 4a–4c illustrate the formation of the source/drain regions and sidewall spacers.

Once the notch 24 has been formed, source and drain extension regions 26 are generally formed as illustrated in FIG. 4a. The extension regions 26 are generally lightly doped drain regions (LDD), but they may also be doped drain regions (DD). The extension regions are formed using an implant, and the third layer 20 of the dummy gate patterns the implant. After the implant has been performed, lateral diffusion of the extension regions 26 occurs due to the thermal processing in subsequent processing steps, and the extension regions 26 generally diffuse to match the depth of the notch 24. This reduces the overlap between the subsequent gate electrode because the extension regions do not extend appreciably under the dummy gate beyond the plane defined by the interior surface of the notches. Additionally, the channel length is reduced to less than that defined by the third layer 20 of the dummy gate 21. Optionally, pocket implants 23 may be formed below the extension regions 26. Pocket implants 23, or halo implants, adjust the punch-through voltage of the transistor to prevent a punch-through between the source and drain of the transistor. Additionally, the pocket implants 23 lower the carrier concentration in the junction between the substrate 10 and the bottom layer of the source and drain, which reduces the junction capacitance and enhances the operation rate of the transistor. The pocket implants 23 may be formed by methods that are well known in the art.

Figure 4B:
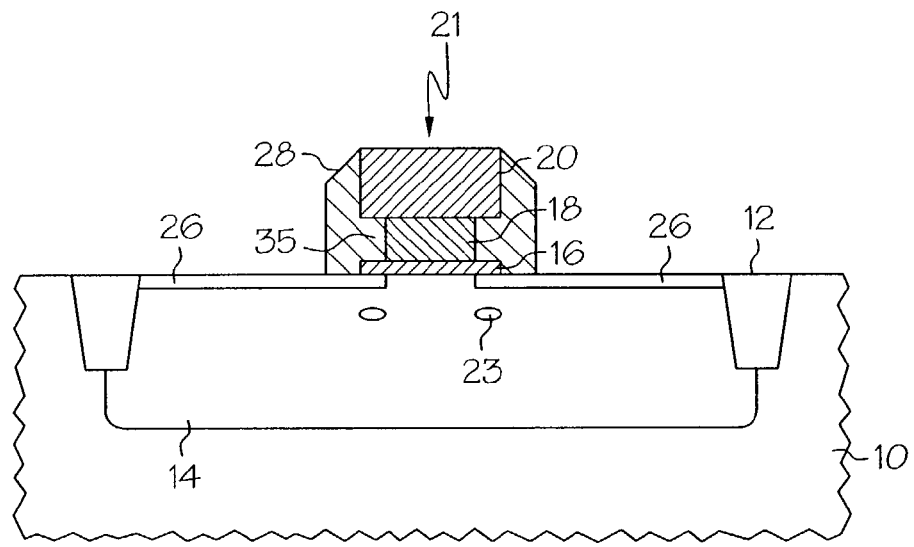
Figure 4C:
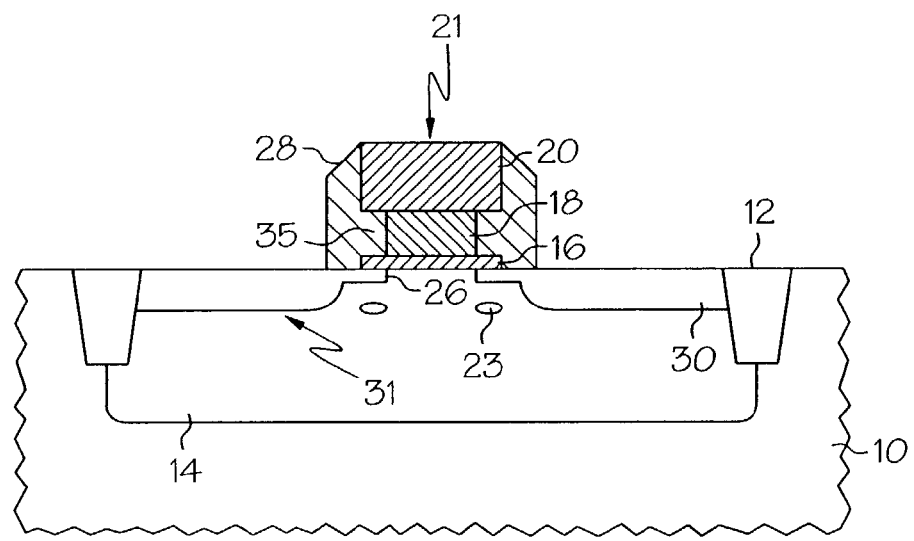

After the formation of the extension regions 26, spacers 28 are formed on the sidewalls of the dummy gate 21, as illustrated in FIG. 4b. The spacers may be formed of tetraethyloxysilicate (TEOS), and the TEOS may be deposited by LPCVD and selectively etched by a dry etch process. Alternatively, the spacers may be an oxide that is deposited by high density plasma chemical vapor deposition (HDP-CVD). Spacers 28 conform to the notched profile of the sidewall of the dummy gate. Therefore, the spacers have protrusions 35 that extend into the notches 24. After the spacers have been formed, a further ion implantation is performed to form doped regions 30, as illustrated in FIG. 4c. The ion implant is generally at a higher concentration and energy than the previous implant, and thus doped regions 30 are illustrated as having a deeper penetration into the well region 14 adjacent to the portion of the extension regions 26 underneath the spacers. The extension regions 26 and the doped regions 30 jointly define the doped source/drain regions 31. The channel length is defined by the separation of the source and the drain.

Figure 5A:
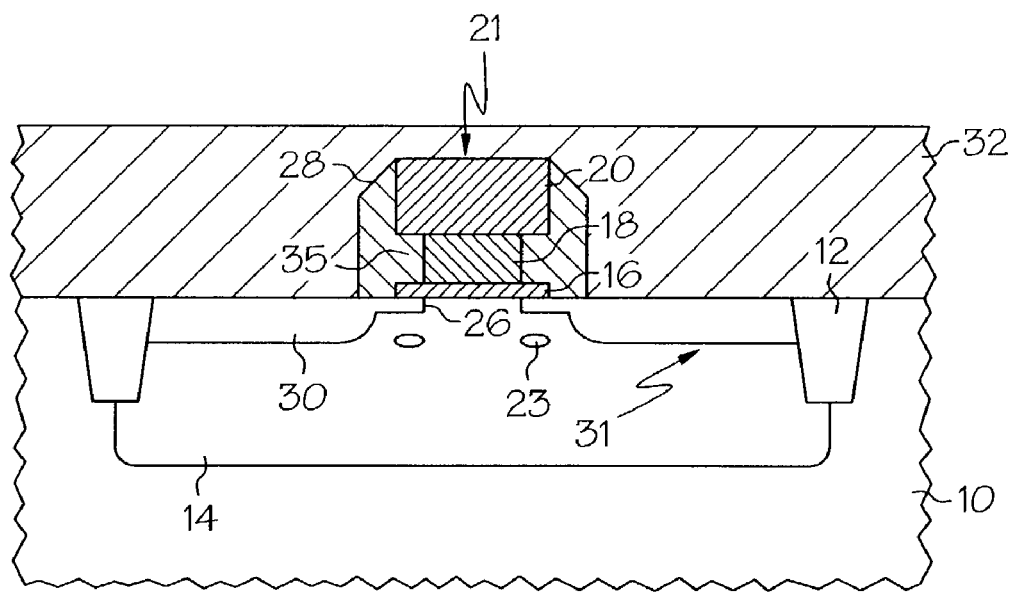
FIGS. 5a–5b illustrate the formation of a planar dielectric layer surrounding the dummy gate in a stepwise fashion.
Figure 5B:
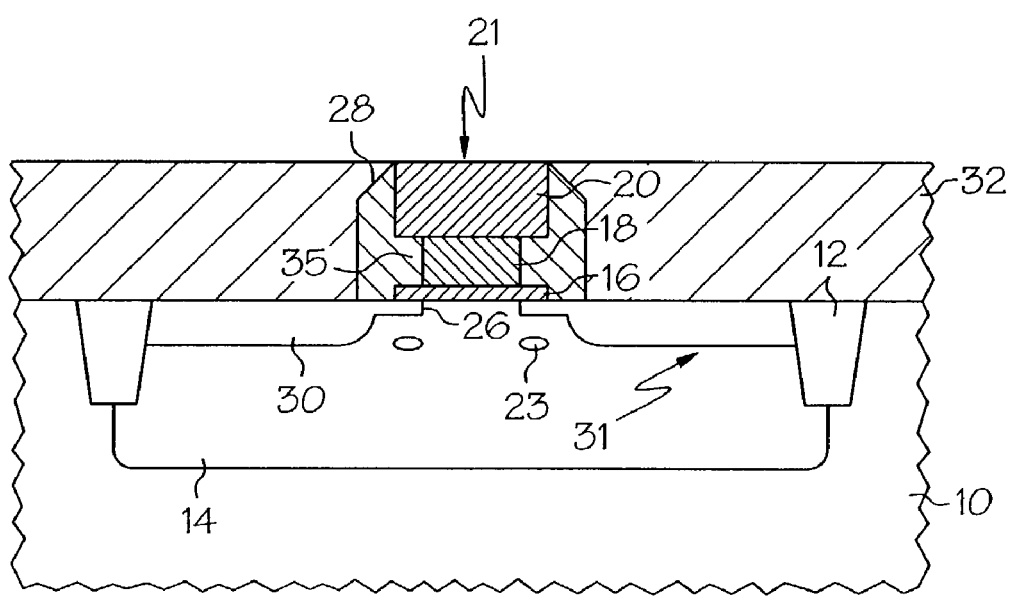

Referring to FIGS. 5a and 5b, an interlayer dielectric (ILD) layer 32 is deposited over the dummy gate 21 and the substrate 10. After deposition, the ILD layer 32 is removed from the area overlying the dummy gate 21. The ILD layer may be removed using conventional chemical mechanical polishing (CMP) techniques. CMP planarizes the dielectric layer. The ILD layer may be any dielectric material, the selection of which may be dependent upon subsequent processes and the intended application. For example the dielectric may be a glass layer, such as borophosphosilicate glass (BPSG), phosphosilicate glass, or spin-on glass.

Figure 6A:
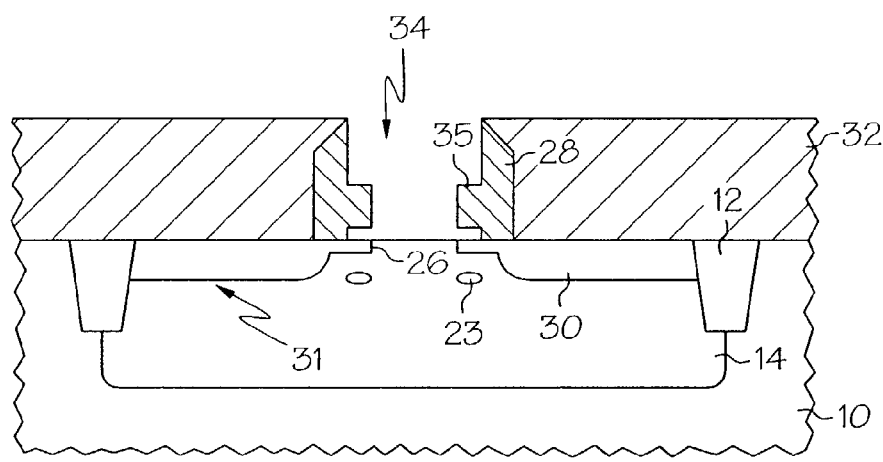
FIGS. 6a–6c illustrate the removal of the dummy gate and the formation of the notched gate in a stepwise fashion.

Referring to FIGS. 5b and 6a, the dummy gate 21 is removed. The removal is accomplished by subsequently etching the layers of the dummy gate 21. The etching may be a wet etch with etchants selected to remove each layer in turn. For example, when the third layer 20 comprises a polysilicon, a nitric acid based solution may be used. When the second layer 18 comprises silicon nitride, a hot phosphoric acid etchant may be used. When the first layer comprises a sacrificial gate oxide, a hydrofluoric acid based solution may be used. After the dummy gate 21 has been removed, a recess 34 bounded by the sidewall spacers 28 and the well 14 remains. The recess 34 is a damascene trench, and has an I-shape due to the protrusions of the sidewall spacers 28.

Figure 6B:
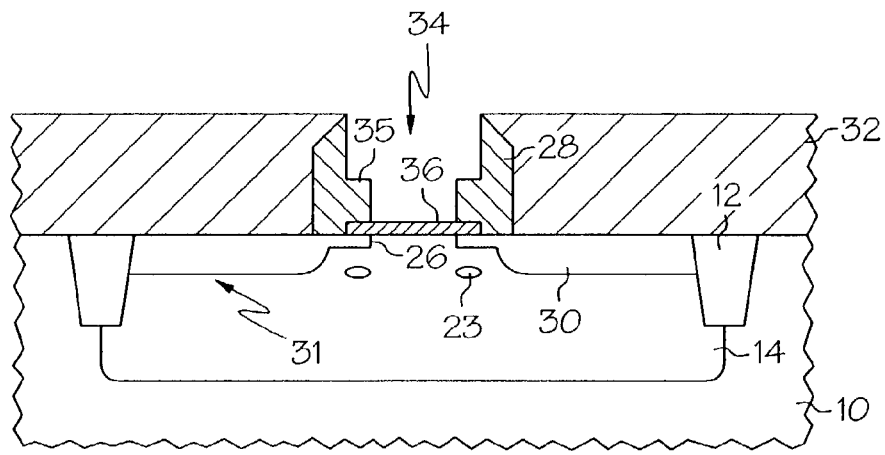
Figure 6C:
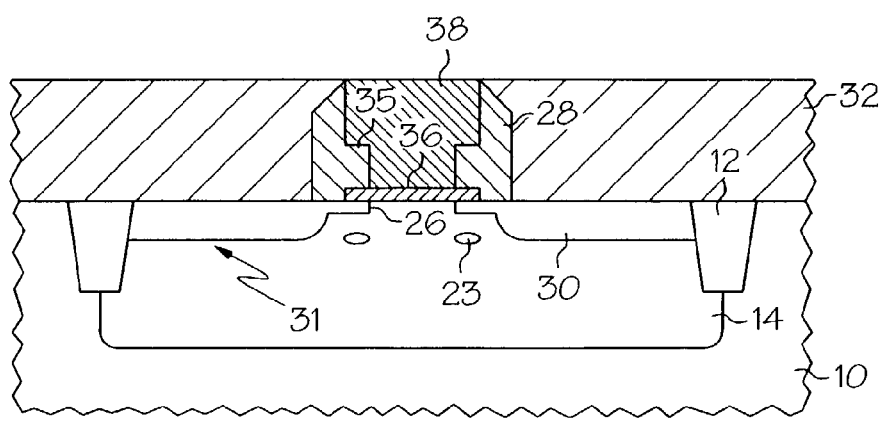

Referring to FIG. 6b, a gate oxide layer 36 is grown in the recess 34 under the protrusions 35 of the sidewall spacers 28. The gate oxide layer 36 may be grown by thermal oxidation of the base substrate, or by other techniques such as chemical vapor deposition (CVD) or atomic layer deposition (ALD). After the gate oxide layer 36 has been deposited it may optionally be annealed or subjected to remote plasma nitridization (RPN) or other post-oxide growth treatments. After the gate oxide has been grown and optionally treated, the permanent gate material that forms the gate electrode 38 is deposited as shown in FIG. 6c. The gate electrode 38 is a conductive material. The gate electrode may be a polysilicon material. Alternatively, the gate electrode may be a metal gate electrode such as tungsten, tungsten silicide, titanium silicide, cobalt silicide, nickel silicide, molybdenum, titanium, titanium nitride, and aluminum. The gate electrode 38 is deposited over the recess 34 and the dielectric layer 32 and then the structure is planarized using CMP techniques for example. If the gate electrode 38 comprises polysilicon, a further doping operation is generally performed.

It will be obvious to those skilled in the art that various changes may be made without departing from the scope of the invention, which is not to be considered limited to what is described in the specification.

This invention claimed is:

1. A method of forming a notched gate comprising:
   supplying a substrate;
   forming a dummy gate on said substrate, said dummy gate having sidewalls;
   etching said dummy gate to form laterally recessed notches, wherein both upper and lower portions of said laterally recessed notches are spaced from said substrate in said dummy gate and wherein said sidewalls of said dummy gate below said lower portions of said laterally recessed notches remain unetched;
   forming sidewall spacers on said sidewalls of said dummy gate, said spacers including protrusions extending into said laterally recessed notches, wherein both upper and lower portions of said protrusions are spaced from said substrate;
   removing said dummy gate to form a recess, wherein said recess includes an air gap defined between said lower portions of said protrusions of said sidewall spacers and said substrate;
   forming a gate oxide in said air gap; and
   depositing a permanent gate material over said gate oxide to form a notched gate.

2. The method of claim 1, wherein said recess comprises a damascene trench.

3. The method of claim 1, wherein said recess is shaped in the form of a capital letter I with serifs.

4. The method of claim 1, wherein said permanent gate material comprises conductive material.

5. A method of forming a notched gate comprising:
   supplying a substrate;
   forming a dummy gate on said substrate, said dummy gate having sidewalls;
   etching said dummy gate to form laterally recessed notches, wherein both upper and lower portions of said laterally recessed notches are spaced from said substrate in said dummy gate and wherein said sidewalls of said dummy gate below said lower portions of said laterally recessed notches remain unetched;
   forming sidewall spacers on said sidewalls of said dummy gate, said spacers including protrusions extending into said laterally recessed notches, wherein both upper and lower portions of said protrusions are spaced from said substrate;
   removing said dummy gate to form a recess, wherein said recess includes an air gap between said lower portions of said protrusions of said sidewall spacers and said substrate;
   forming a gate oxide in said air gap; and
   depositing a permanent gate material over said gate oxide and in contact with said sidewall spacers to form a notched gate.

* * * * *